United States Patent
Dyachenko et al.

(10) Patent No.: US 10,826,387 B2
(45) Date of Patent: Nov. 3, 2020

(54) CHARGE PUMP AND METHOD FOR OPERATING A CHARGE PUMP

(71) Applicant: NXP B.V., Eindhoven (NL)

(72) Inventors: Vladislav Dyachenko, Eindhoven (NL); Nenad Pavlovic, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/201,088

(22) Filed: Nov. 27, 2018

(65) Prior Publication Data

US 2020/0169166 A1 May 28, 2020

(51) Int. Cl.
*H02M 3/07* (2006.01)
*H03L 7/089* (2006.01)

(52) U.S. Cl.
CPC ............ *H02M 3/07* (2013.01); *H03L 7/0895* (2013.01)

(58) Field of Classification Search
CPC ............................. H02M 3/07; H03L 7/0895
See application file for complete search history.

(56) References Cited

U.S. PATENT DOCUMENTS

| | | | | |
|---|---|---|---|---|
| 7,075,348 B2* | 7/2006 | Hsu | ........................ | H03L 7/0896 327/157 |
| 7,081,781 B2* | 7/2006 | Zhu | ........................ | H03L 7/0896 327/157 |
| 7,184,510 B2* | 2/2007 | Jung | ........................ | H02M 3/07 327/157 |
| 7,202,717 B2* | 4/2007 | Keaveney | ............ | H03K 3/0231 327/157 |
| 9,768,684 B1* | 9/2017 | Banerjee | ................. | H03L 7/099 |
| 10,361,707 B2* | 7/2019 | Strom | ..................... | H03L 7/093 |
| 10,581,439 B1 | 3/2020 | Pavlovic et al. | | |
| 2005/0237091 A1* | 10/2005 | Lindner | ............... | H03L 7/0893 327/157 |
| 2013/0265104 A1 | 10/2013 | Beale et al. | | |
| 2016/0238998 A1 | 8/2016 | Pavlovic et al. | | |
| 2016/0241301 A1 | 8/2016 | Pavlovic et al. | | |

FOREIGN PATENT DOCUMENTS

| | | | |
|---|---|---|---|
| EP | 2101414 A1 | 9/2009 | |
| FR | 2754959 B1 | 12/1998 | |

OTHER PUBLICATIONS

J.-S. Lee, M.-S. Keel, S.-I. Lim, S. Kim, "Charge pump with perfect current matching characteristics in phase-locked loops", Electronics Letters, vol. 36, No. 23, pp. 1907-1908, 2000.

N. D. Dalt and C. Sandner, "A subpicosecond jitter PLL for clock generation in 0.12—mu digital CMOS," IEEE Journal of Solid-State Circuits, vol. 38, No. 7, pp. 1275-1278, Jul. 2003.

S. Cheng, H. Tong, J. Silva-Martinez, A. I. Karsilayan, "Design and analysis of an ultrahighspeed glitch-free fully differential charge pump with minimum output current variation and accurate matching", IEEE Trans. Circuits Syst. II: Express Briefs, vol. 53, No. 9, pp. 843-847, Sep. 2006.

* cited by examiner

*Primary Examiner* — Dinh T Le

(57) ABSTRACT

Embodiments of a method for operating a charge pump and a charge pump are disclosed. In an embodiment, a method for operating a charge pump involves during a first operating phase of the charge pump, setting a first current source of the charge pump according to a second current source of the charge pump, and, during a second operating phase of the charge pump that is subsequent to the first operating phase, providing current from the first current source to a load of the charge pump.

20 Claims, 9 Drawing Sheets

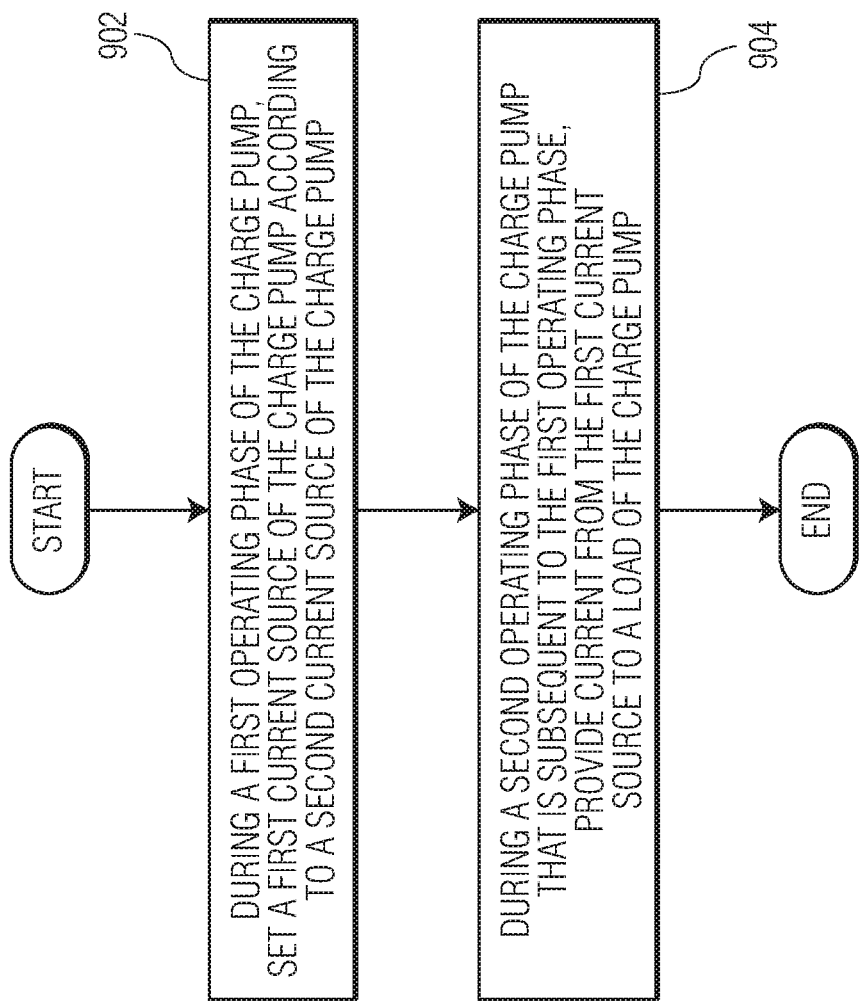

CHARGE PUMP AND METHOD FOR OPERATING A CHARGE PUMP

BACKGROUND

A charge pump can be implemented in numerous circuits including in a phase/frequency detector (PFD) in a phase locked loop (PLL). A charge pump can provide a current into a loop filter of a PLL proportional to a phase error at the PFD input. The current is converted to a voltage, which in turn regulates frequency of voltage controlled oscillator. However, accuracy of the charge pump output current and, therefore, PLL performance itself can be negatively affected due to numerous undesired effects such as device matching, changing output voltage over time, on-chip interference, etc.

SUMMARY

Embodiments of a method for operating a charge pump and a charge pump are disclosed. In one embodiment, a method for operating a charge pump involves during a first operating phase of the charge pump, setting a first current source of the charge pump according to a second current source of the charge pump, and, during a second operating phase of the charge pump that is subsequent to the first operating phase, providing current from the first current source to a load of the charge pump. Other embodiments are also described.

In an embodiment, during the first operating phase of the charge pump, the charge pump provides no current to the load.

In an embodiment, during the first operating phase of the charge pump, setting the first current source of the charge pump according to the second current source of the charge pump involves during the first operating phase of the charge pump, setting the first current source of the charge pump to have the same current level as the second current source of the charge pump.

In an embodiment, during the first operating phase of the charge pump, setting the first current source of the charge pump to have the same current level as the second current source of the charge pump involves during the first operating phase of the charge pump, setting the first current source of the charge pump using at least one error amplifier having an output terminal connected to the first current source and an input terminal connected to a reference voltage.

In an embodiment, a charge pump includes at least a first current source and a second current source and a control unit connected to the at least first and second current sources. The control unit is configured to during a first operating phase of the charge pump, set the first current source of the charge pump according to the second current source of the charge pump, and during a second operating phase of the charge pump that is subsequent to the first operating phase, provide current from the first current source to a load of the charge pump.

In an embodiment, during the first operating phase of the charge pump, the charge pump provides no current to the load.

In an embodiment, the control unit is further configured to, during the first operating phase of the charge pump, set the first current source of the charge pump to have the same current level as the second current source of the charge pump.

In an embodiment, the control unit includes a feedback element having at last one error amplifier whose output controls a current level provided by the first current source.

In an embodiment, the charge pump further includes a third voltage source and a fourth voltage source. The control unit is further configured to during the first operating phase of the charge pump, set the third current source of the charge pump according to the fourth current source of the charge pump, and during the second operating phase of the charge pump that is subsequent to the first operating phase, provide current from the third current source to the load of the charge pump.

In an embodiment, the control unit includes a feedback element connected to the first and third current sources and multiple switches. The feedback element includes a first error amplifier having an output terminal connected to the first current source and a first input terminal connected to a first capacitor connected to a reference voltage and a first feedback switch, and a second error amplifier having an output terminal connected to the third current source and a first input terminal connected to a second capacitor connected to the reference voltage and a second feedback switch. The switches are connected between the first, second, third, and fourth current sources, the first and second feedback switches, and the load.

In an embodiment, the switches include a first switch connected to the first current source and to the load, a second switch connected to the load, to the fourth current source, and to the first switch, a third switch connected to the first current source and to the first feedback switch, a fourth switch connected to the fourth current source and to the second feedback switch, a fifth switch connected to the third current source, to the second feedback switch, and to the fourth switch, a sixth switch connected to the fourth current source, to the third switch, and to the first feedback switch, a seventh switch connected to the third current source and to the load, and an eighth switch connected to the fourth current source, to the seventh switch, and to the load.

In an embodiment, the first error amplifier is configured to, during the first operating phase, compare a threshold voltage with a sampled voltage at the first capacitor to generate a control signal for setting the first current source of the charge pump to have the same current level as the second current source of the charge pump. The second error amplifier is configured to, during the first operating phase, compare the threshold voltage with a sampled voltage at the second capacitor to generate a control signal for setting the third current source of the charge pump to have the same current level as the fourth current source of the charge pump.

In an embodiment, the control unit includes a feedback element connected to the first and third current sources and multiple switches. The feedback element includes an error amplifier having an output terminal connected to the first and third current sources through two switches and a first input terminal connected to a reference voltage. The switches are connected between the first, second, third, and fourth current sources, a second input terminal of the error amplifier, and the load.

In an embodiment, the switches include a first switch connected to the first current source and to the load, a second switch connected to the load, to the fourth current source, and to the first switch, a third switch connected to the first current source and to the second input terminal of the error amplifier, a fourth switch connected to the fourth current source, to the second input terminal of the error amplifier, and to the third switch, a fifth switch connected to the first current source and to a voltage source, a sixth switch connected to the fourth current source, to the fifth switch, and to the voltage source, a seventh switch connected to the third current source and to the voltage source, an eighth switch connected to the second current source, to the seventh switch, and to the voltage source, a ninth switch connected to the third current source and to the second input terminal of the error amplifier, a tenth switch connected to the second current source, to the second input terminal of the error amplifier, and to the ninth switch, an eleventh switch connected to the second current source and to the load, and a twelfth switch connected to the load, to the second current source, and to the eleventh switch.

In an embodiment, the first and twelfth switches are controlled by a first signal, wherein the second and eleventh switches are controlled by a second signal. The third and tenth switches are controlled by a third signal. The fourth and ninth switches are controlled by a fourth signal. The fifth and eighth switches are controlled by a fifth signal. The sixth and seventh switches are controlled by a sixth signal.

In an embodiment, the control unit includes a feedback element connected to the first current source and multiple switches. The feedback element includes an error amplifier having an output terminal connected to the first current source and a first input terminal connected to a reference voltage. The switches are connected between the first and second current sources, a second input terminal of the error amplifier, and the load.

In an embodiment, the error amplifier is configured to, during the first operating phase, compare the reference voltage with a voltage at the second input terminal to generate a control signal for setting the first current source of the charge pump to have the same current level as the second current source of the charge pump.

In an embodiment, the switches include a first switch connected to the first current source and to the second input terminal of the error amplifier, a second switch connected to the first switch, to the second current source, and to the second input terminal of the error amplifier, a third switch connected to the first switch, to the first current source, and to a voltage source, a fourth switch connected to the third switch, to the second current source, and to the voltage source, a fifth switch connected to the first and third switches, to the first current source, and to the load, and a sixth switch connected to the fifth switch, to the second current source, and to the load.

In an embodiment, the first and second switches are controlled by a first signal. The fourth and fifth switches are controlled by a second signal. The third and sixth switches are controlled by a third signal.

In an embodiment, current flows through the load in opposite directions at alternating time periods.

In an embodiment, a charge pump includes first, second, third, and fourth current sources, and a control unit connected to the first, second, third, and fourth current sources. The control unit includes a feedback element connected to the first and third current sources and first, second, third, fourth, fifth, sixth, seventh, and eighth switches. The feedback element includes a first error amplifier having an output terminal connected to the first current source and a first input terminal connected to a first capacitor connected to a reference voltage and a first feedback switch and a second error amplifier having an output terminal connected to the third current source and a first input terminal connected to a second capacitor connected to the reference voltage and a second feedback switch. The first error amplifier is configured to, during an inactive operating phase during which the charge pump provides no current to a load, compare a threshold voltage with a sampled voltage at the first capacitor to generate a control signal for setting the first current source of the charge pump to have the same current level as the second current source of the charge pump. The second error amplifier is configured to, during the inactive operating phase, compare the threshold voltage with a sampled voltage at the second capacitor to generate a control signal for setting the third current source of the charge pump to have the same current level as the fourth current source of the charge pump. The first switch is connected to the first current source and to the load. The second switch is connected to the load, to the fourth current source, and to the first switch. The third switch is connected to the first current source and to the first feedback switch. The fourth switch is connected to the fourth current source and to the second feedback switch. The fifth switch is connected to the third current source, to the second feedback switch, and to the fourth switch. The sixth switch is connected to the fourth current source, to the third switch, and to the first feedback switch. The seventh switch is connected to the third current source and to the load. The eighth switch is connected to the fourth current source, to the seventh switch, and to the load.

In an embodiment, during the inactive operating phase, each of the first, second, third, and fourth current sources is connected to the load through the first switch, the second switch, the seventh switch, and the eighth switch, respectively, and the charge pump provides no current to the load.

Other aspects in accordance with the invention will become apparent from the following detailed description, taken in conjunction with the accompanying drawings, illustrated by way of example of the principles of the invention.

BRIEF DESCRIPTION OF THE DRAWINGS

FIG. 9 is a process flow diagram that illustrates a method for operating a charge pump in accordance with an embodiment of the invention.

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
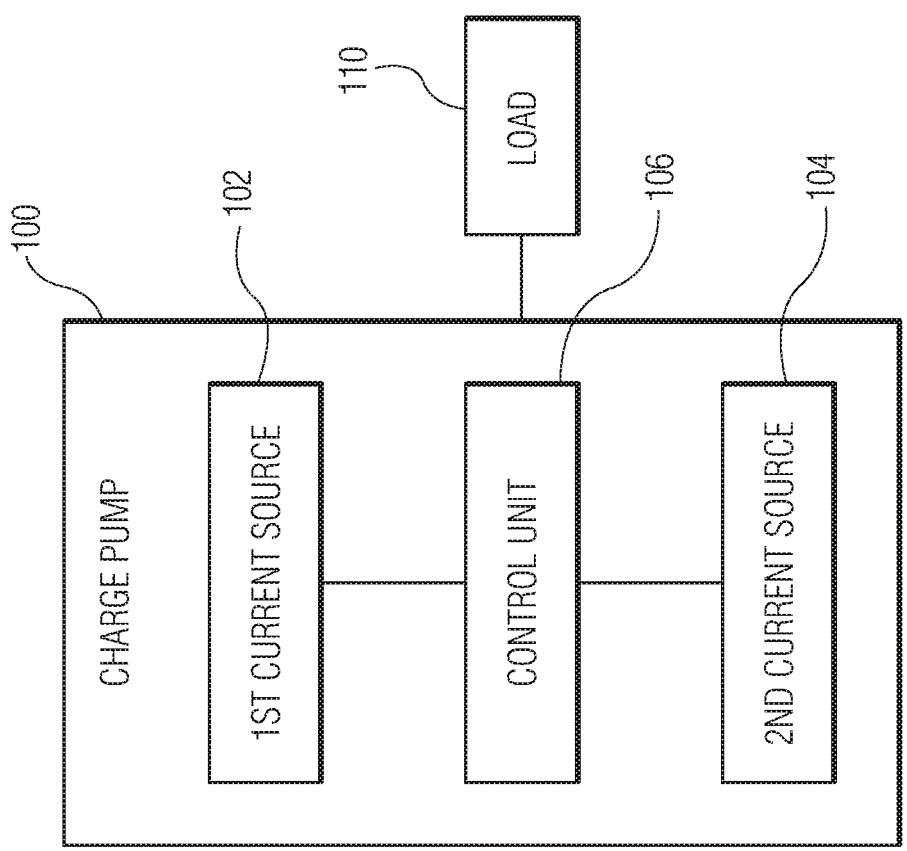
FIG. 1 is a schematic block diagram of a charge pump in accordance with an embodiment of the invention.

FIG. 1 is a schematic block diagram of a charge pump 100 in accordance with an embodiment of the invention. The charge pump can provide current to a load 110. In the embodiment depicted in FIG. 1, the charge pump includes a first current source 102, a second current source 104, and a control unit 106 connected to the first and second current sources. Although the illustrated charge pump is shown with certain components and described with certain functionality herein, other embodiments of the charge pump may include fewer or more components to implement the same, less, or more functionality. For example, although the charge pump is shown in FIG. 1 as including two current sources, in other embodiments, the charge pump may include more than two current sources. For example, the charge pump may include four current sources and may operate as a differential charge pump.

In the embodiment depicted in FIG. 1, the control unit 106 is configured to control the supply of current from the first and second current sources 102, 104 to the load 110. The control unit may include one or more switching devices, such as n-channel MOSFET (NMOS) transistors, p-channel MOSFET (PMOS) transistors, or other types of transistors. In some embodiments, the control unit is configured to, during a first operating phase of the charge pump, set the first current source of the charge pump according to the second current source of the charge pump, and during a second operating phase of the charge pump that is subsequent to the first operating phase, provide current from the first current source to a load of the charge pump. Because the first current source of the charge pump is set according to the second current source of the charge pump, current mismatch in the charge pump can be reduced or eliminated. Consequently, the performance of the charge pump can be improved. In addition, because the first current source of the charge pump is set during one operating phase and is used to provide current to the load of the charge pump during another operating phase, the first current source can be adjusted while the charge pump is inactive. Consequently, the performance of the charge pump is not negatively affected by the voltage disturbance at an output of the charge pump.

In some embodiments, the first operating phase of the charge pump 100 is an inactive operating phase of the charge pump during which the charge pump provides no current to the load 110, and the second operating phase of the charge pump is an active operating phase of the charge pump during which the charge pump provides current to the load. Consequently, the first current source 102 of the charge pump can be set during the inactive operating phase and the load 110 can be supplied with the adjusted current from the first current source during the active operating phase.

In some embodiments, the control unit 106 is further configured to, during the first operating phase of the charge pump 100, set the first current source 102 of the charge pump to have the same current level as the second current source 104 of the charge pump. In some embodiments, the control unit 106 includes at last one error amplifier whose output controls a current level provided by the first current source.

Figure 2:
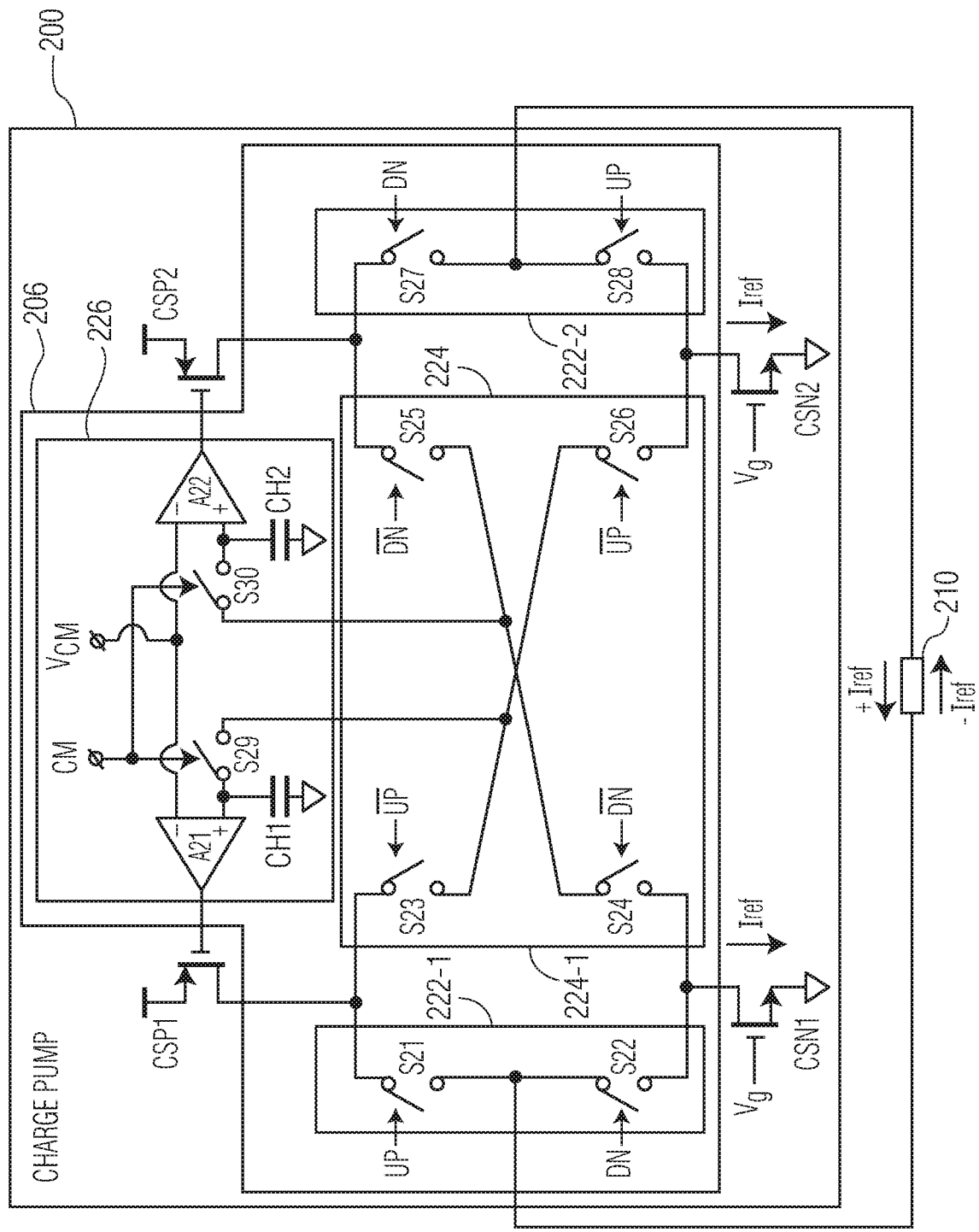
FIG. 2 depicts a differential charge pump in accordance with an embodiment of the invention.

FIG. 2 depicts a differential charge pump 200 in accordance with an embodiment of the invention. The differential charge pump depicted in FIG. 2 is an embodiment of the charge pump 100 depicted in FIG. 1. However, the charge pump depicted in FIG. 1 is not limited to the embodiment shown in FIG. 2. In the embodiment depicted in FIG. 2, the differential charge pump includes reference current sources, CSN1, CSN2, controlled current sources, CSP1, CSP2, and a control unit 206 configured to control the supply of current from the current sources to a load 210 at the charge pump output. In the embodiment depicted in FIG. 2, the reference current sources, CSN1, CSN2, and the controlled current sources, CSP1, CSP2, are implemented as transistors. The current sources, CSP1, CSP2, may be connected to a positive voltage, while the current sources, CSN1, CSN2 may be connected to a reference voltage, such as ground. Although the illustrated differential charge pump is shown with certain components and described with certain functionality herein, other embodiments of the differential charge pump may include fewer or more components to implement the same, less, or more functionality.

In the embodiment depicted in FIG. 2, the control unit 206 includes load switch sets 222-1, 222-2, a cross coupled switch set 224, and a feedback element 226. The load switch sets are connected to the load 210. The load switch set 222-1 is connected between the current source, CSP1, and the current source, CSN1. The load switch set 222-1 includes two switches, S21, S22. The load switch set 222-2 is connected between the current source, CSP2, and the current source, CSN2. The load switch set 222-2 includes two switches, S27, S28. The cross-coupled switch set 224 is connected between the current sources CSP1, CSP2, CSN1, CSN2 and includes four cross-coupled switches, S23, S24, S25, S26. The switches, S21, S28, are controlled by a control signal, UP, and the switches, S22, S27, are controlled by a control signal, DN, the switches S23, S26, are controlled by a control signal, $\overline{\text{UP}}$, which has an opposite polarity of the control signal, UP, and the switches S24, S25, are controlled by a control signal, $\overline{\text{DN}}$, which has an opposite polarity of the control signal, DN. The control unit is configured to, during an inactive operating phase of the differential charge pump 200 when the differential charge pump provides no current to the load, set the current source, CSP1, according to the current source, CSN2, and/or set the current source, CSP2, according to the current source, CSN1, and during an active operating phase of the charge pump that is subsequent to the first operating phase when the differential charge pump provides current to the load, provide current from the current source, CSP1, and/or the current source, CSP2, to the load of the differential charge pump.

In the embodiment depicted in FIG. 2, the feedback element 226 includes two error amplifiers, A21, A22, two capacitors, CH1, CH2, and two switches, S29, S30, which are controlled by a control signal, CM. The capacitors, CH1, CH2, may be connected to a reference voltage, such as ground. The capacitors, CH1, CH2, function as a memory element, which keeps the gate voltage of the current sources, CSP1, CSP2, at a certain voltage level, during an active phase of the differential charge pump. In the embodiment depicted in FIG. 2, the control signal, CM, is generated based on the control signals, DN, and UP. In some embodiments, the control signal, CM, is generated using a NOR gate. For example, the control signal, CM, is the output of the NOR gate and the control signals, DN, and UP, are inputs to the NOR gate (e.g., CM=$\overline{DN\|UP}$). In some embodiments, the capacitors, CH1, CH2, are not included in the feedback element when parasitic capacitance at the input of the error amplifiers, A21, A22, is sufficient. In the embodiment depicted in FIG. 2, the switch, S21, is connected to the current source, CSP1, and to the load 210. The switch, S22, is connected to the load, to the current source, CSN1, and to the switch, S21. The switch, S23, is connected to the current source, CSP1, and to the switch, S29. The switch, S24, is connected to the current source, CSN1, and to the switch, S30. The switch, S25, is connected to the current source, CSP2, to the switch, S30, and to the switch, S24. The switch, S26, is connected to the current source, CSN2, to the switch, S23, and to the switch, S29. The switch, S27, is connected to the current source, CSP2, and to the load. The switch, S28, is connected to the current source, CSN2, to the switch, S27, and to the load. The switch, S29, is connected to the switches S23, S26, and the switch, S30, is connected to the switches S24, S25. A first input terminal of the error amplifier, A21, is connected to a voltage, $V_{CM}$, a second input terminal of the error amplifier, A21, is connected to the switch, S29, and to the capacitor, CH1, and an output terminal of the error amplifier, A21, is connected to the current source, CSP1. A first input terminal of the error amplifier, A22, is connected to the voltage, $V_{CM}$, a second input terminal of the error amplifier, A22, is connected to the switch, S30, and to the capacitor, CH2, and an output terminal of the error amplifier, A22, is connected to the current source, CSP2. The cross-coupled switch set, the current sources, CSP1, CSP2, and the feedback element form two feedback loops (A21-CSP1-S23, S29 and A22-CSP2-S25-S30). In the embodiment depicted in FIG. 2, the current sources, CSP1, CSP2, are controlled by the feedback element and the current sources, CSN2, CSN1, are used as reference current sources. However, in some other embodiments, the current sources, CSN2, CSN1, are controlled by a feedback element and the current sources, CSP1, CSP2, are used as reference current sources.

An example of the operation of the differential charge pump 200 depicted in FIG. 2 is described as follows. When the control signals, UP and DN, are at 0, the switches, S21, S22, S27, S28, are open (i.e., non-conductive), and the current sources, CSP1, CSP2 CSN1, CSN2, are disconnected from the load 210, whereas switches, S23-S26, are closed (i.e., conductive), and the current flows from the current source CSP1, to the current source, CSN2, and from the current source, CSP2, to the current source, CSN1. Since both UP and DN control signals are 0, the signal, CM, which is generated using Boolean operation $\overline{DN\|UP}$, is 1, and, therefore, the switches, S29, S30, are closed (i.e., conductive), making two feedback loops A21-CSP1-S23, S29 and A22-CSP2-S25-S30 active. The error amplifiers, A21, A22, compare voltage at their non-inverting inputs with the voltage, $V_{CM}$, and generate compensation error voltage, which is applied to the gate terminals of the current sources, CSP1, CSP2, setting the currents of the current sources, CSP1, CSP2, to be equal to the reference currents, Iref, flowing via the current sources, CSN2 and CSN1, respectively. The capacitors, CH1, CH2, track the voltage at the non-inverting inputs of the error amplifiers, A21, A22. As soon as the control signal, UP or DN, changes from 0 to 1, the control signal, CM, changes from 1 to 0 (e.g., CM= $\overline{DN\|UP}$), opening the switches S29, S30 (i.e., non-conductive), and the voltage at the non-inverting inputs of the error amplifiers, A21, A22 is held on the capacitors, CH1, CH2, respectively. If the UP signal changes to 1 and the DN signal remains at 0, the switches, S23, S26, are open (i.e., non-conductive), and, S21, S28, are closed (i.e., conductive). As a result, current flows through the load via switches S21 and S28, from the current source, CSP1, to the current source, CSN2, and depicted as −Iref in FIG. 2. At this moment, the switches, S24, S25, are closed (i.e., conductive), maintaining a current flow from the current source, CSP2, to the current source, CSN1, in order to keep the current sources, CSP2, and CSN1, in saturation. If the DN signal changes to 1 and the UP signal remains 0, the switches, S24, S25, are open (i.e., non-conductive), and, the switches, S22, S27, are closed (i.e., conductive). As a result, the current flows through the load via switches, S27 and S22, from the current source, CSP2, to the current source, CSN1, and depicted as +Iref in FIG. 2. At this moment, the switches S23, S26 are closed (i.e., conductive), maintaining a current flow from the current source CSP1 to the current source, CSN2, in order to keep the current sources, CSP1, and CSN2, in saturation. When the control signals, UP and DN, are at 1, the switches S23, S24, S25, S26, are open (i.e., non-conductive) and the switches S21, S22, S27, S28 are closed (i.e., conductive). In this case, there is no current flow through the switches S23, S24, S25, S26 and the load 210. The current flow from the current source, CSP1, to the current source, CSN1, through the switches, S21, S22, and from the current source, CSP2, to the current source, CSN2, through the switches S27, S28.

Figure 3:
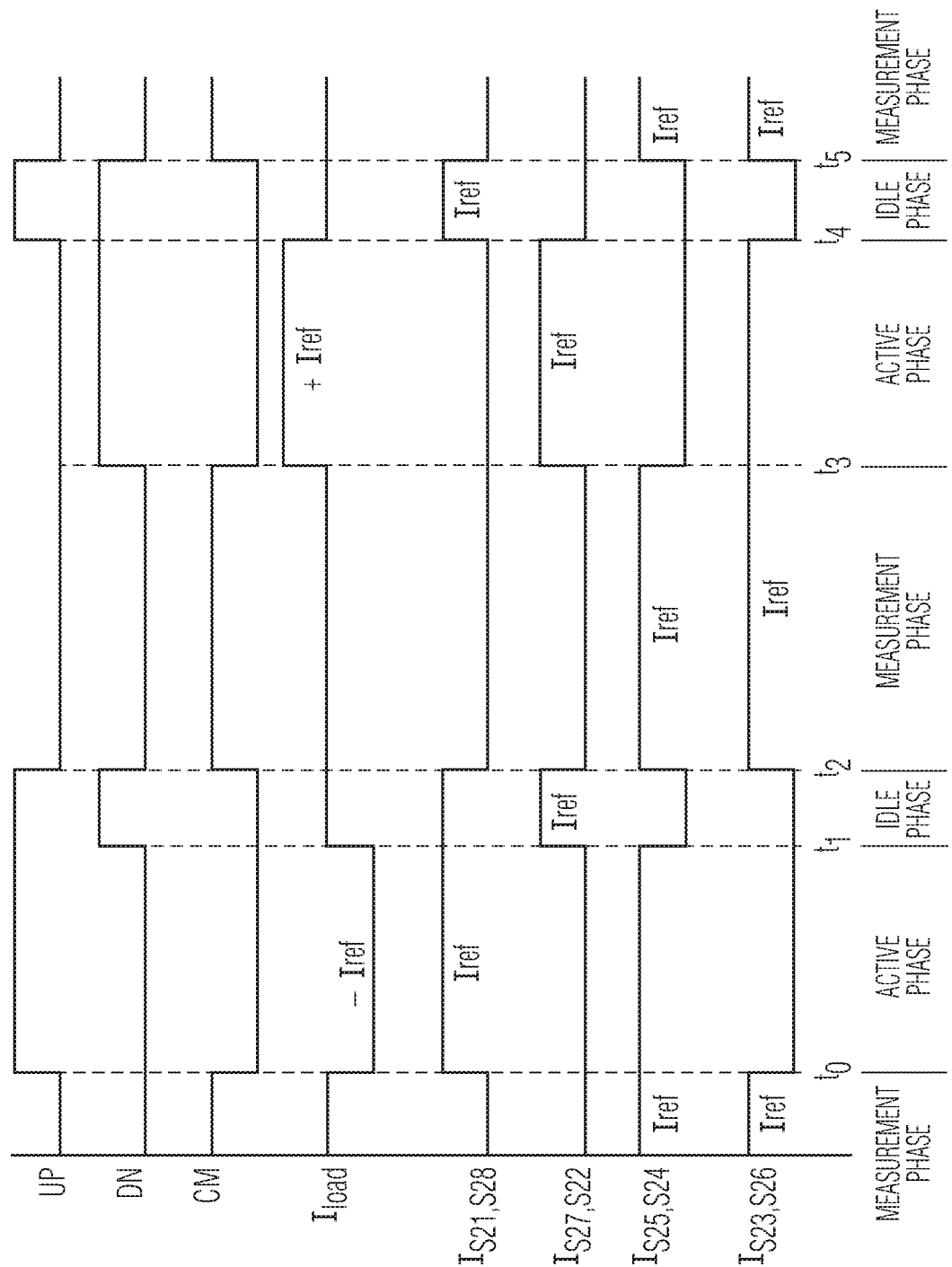
FIG. 3 illustrates a signal timing diagram of the differential charge pump depicted in FIG. 2.

FIG. 3 illustrates a signal timing diagram of the differential charge pump 200 depicted in FIG. 2. In the signal timing diagram illustrated in FIG. 3, the control signals UP, DN and CM, the load current, $I_{load}$, flowing through the load 210, the current, $I_{S21,S28}$, flowing through the switches S21, S28, the current, $I_{S27,S22}$, flowing through the switches S27, S22, the current, $I_{S25,S24}$, through the switches S25, S24, and the current, $I_{S23,S26}$, through the switches S23, S26, are shown in active, measurement, and idle phases of the differential charge pump. The load current, $I_{load}$, is the current that flows through the load when the UP signal is 1 and the DN signal is 0, or when the DN signal is 1 and the UP signal is 0. At time point, $t_0$, the control signal, UP, changes from 0 to 1, starts the active phase of the differential charge pump, i.e., the time period when the differential charge pump provides current to the load. Starting from time point, $t_0$, the load current, $I_{load}$, is equal to $-I_{ref}$, indicating that the load current, $I_{load}$, flows from the current source, CSP1, to the current source, CSN2, via the load and via the switches S21, S28 (current $I_{S21,S28}$ in FIG. 3). At the same time, the current $I_{S25,S24}$ flows through the switches, S25, S24, to keep the current sources, CSP2, CSN1, in saturation. At time point, $t_1$, the DN signal changes from 0 to 1 and the idle phase of the differential charge pump starts. During this idle phase, the switches S21, S22, S27, S28 are closed (i.e., conductive), and the switches S23-S26 are open (i.e., non-conductive). As a result, there is no current flowing through the switches S23, S26 or the switches S24, S25 (i.e., $I_{S23,S26}$ and $I_{S25,S24}$ being zero). During this idle phase, there is no current flowing through the load, as well, since the current flows directly from the current source, CSP1, to the current source, CSN1, and from the current source, CSP1, to the current source, CSN1, via the switches S21, S22 and S27, S29, respectively. At time point, $t_2$, both control signals, UP and DN, are changing from logic 1 to logic 0, forcing the signal CM to 1 (e.g., CM=$\overline{DN\|UP}$), and the measurement phase of the differential charge pump starts during which the current flow via switches S23, S26 ($I_{S23,S26}$) and S25, S24 ($I_{S25,S24}$). At time point $t_3$, the control signal, DN, changes from 0 to 1, forcing the signal CM to 0. Starting from time point, $t_3$, the load current, $I_{load}$, is equal to +$I_{ref}$ indicating that the load current, $I_{load}$, flows from the current source, CSP2, to the current source, CSN1, via the load and via the switches S27, S22 ($I_{S27,S22}$). At the same time, the current $I_{S23,S26}$ flows to keep the current sources, CSP1, CSN2, in saturation. At time point, $t_4$, the UP signal changes from 0 to 1 and the idle phase described above starts. At time point, $t_5$, the measurement phase during which one or more of the current sources, CSP1, CSP2, can be adjusted starts again.

Figure 4:
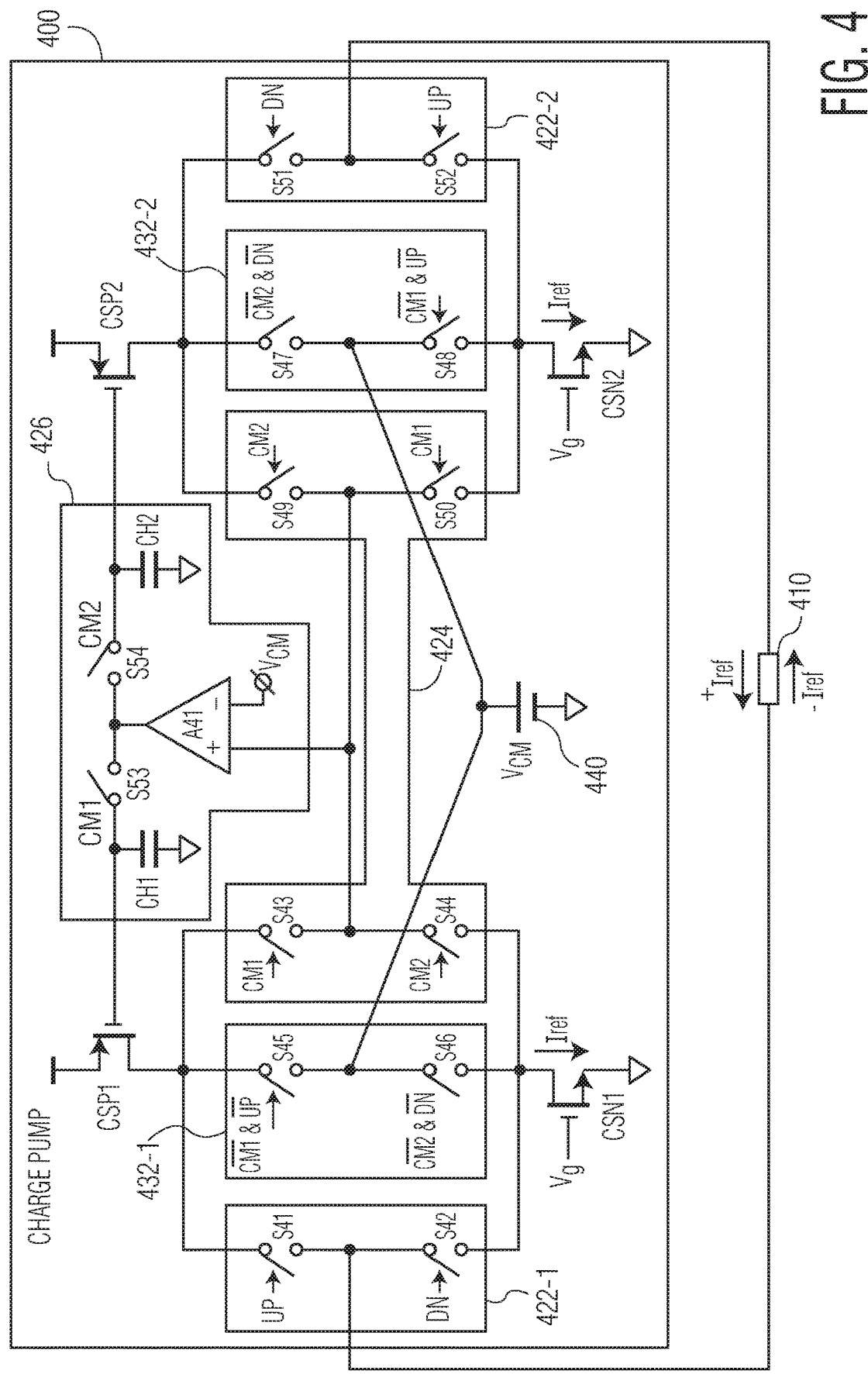
FIG. 4 depicts a differential charge pump in accordance with another embodiment of the invention.

FIG. 4 depicts a differential charge pump 400 in accordance with another embodiment of the invention. The differential charge pump depicted in FIG. 4 is an embodiment of the charge pump 100 depicted in FIG. 1. However, the charge pump depicted in FIG. 1 is not limited to the embodiment shown in FIG. 4. In the embodiment depicted in FIG. 4, the differential charge pump includes reference current sources, CSN1, CSN2, controlled current sources, CSP1, CSP2, and a control unit 406 configured to control the supply of current from the current sources to a load 410 of the differential charge pump. A difference between the charge pump 400 depicted in FIG. 4 and the charge pump 200 depicted in FIG. 2 is that the charge pump 400 depicted in FIG. 4 uses a single error amplifier, A41, in the feedback element 426 to adjust current sources CSP1, CSP2 while the charge pump 200 depicted in FIG. 2 uses two error amplifiers, A21, A22. Although the illustrated differential charge pump is shown with certain components and described with certain functionality herein, other embodiments of the differential charge pump may include fewer or more components to implement the same, less, or more functionality.

In the embodiment depicted in FIG. 4, the control unit 406 includes load switch sets 422-1, 422-2, a cross coupled switch set 424, dummy switch sets 432-1, 432-2, a feedback element 426, and a voltage source 440 connected to the dummy switch sets and having a voltage of $V_{CM}$. The load switch set 422-1 include two switches, S41, S42, the load switch 422-2 includes two switches, S51, S52, the cross coupled switch set 424 includes four switches, S43, S44, S49, S50, the dummy switch set 432-1 includes two switches, S45, S46, and the dummy switch set 432-2 includes two switches, S47, S48. The switches, S43, S44, S49, S50, the switches, S45, S46, S47, S48, and the feedback element form a feedback loop. The feedback element includes the error amplifier, A41, two capacitors, CH1, CH2, and two switches, S53, S54. The load switches, S41, S42, S51, S52, are connected to the load 410, and the switches S43, S44, S49, S50 are connected to the error amplifier, A41. The load switches S41, S42, are connected between the current source, CSP1, and the current source, CSN1. In the embodiment depicted in FIG. 4, the switch, S41, is connected to the current source, CSP1, and to the load 410, the switch, S42, is connected to the load, to the current source, CSN1, and to the switch S41, the switch, S43, is connected to the current source, CSP1, and to the non-inverting input terminal of the error amplifier, A41, the switch, S44, is connected to the current source, CSN1, to the non-inverting input terminal of the error amplifier, A41, and to the switch, S43, the switch, S45, is connected to the current source, CSP1, and to the voltage source 440, the switch, S46, is connected to the current source, CSN1, to the switch, S45, and to the voltage source, the switch, S47, is connected to the current source, CSP2, and to the voltage source, the switch, S48, is connected to the current source, CSN2, to the switch, S47, and to the voltage source, the switch, S49, is connected to the current source, CSP2, and to the non-inverting input terminal of the error amplifier, A41, the switch, S50, is connected to the current source, CSN2, to the non-inverting input terminal of the error amplifier, A41, and to the switch, S49, the switch, S51, is connected to the current source, CSP2, and to the load, and the switch, S52, is connected to the load, to the current source, CSN2, and to the switch, S51. The switches, S42, S51 are controlled by a control signal, DN, and the switches, S41, S52, are controlled by a control signal, UP. The switches, S53, S54, are controlled by control signals, CM1, CM2, respectively. Control signals for the dummy switches, S45, S46, S47, S48, are generated based on the control signals, DN, UP, CM1, and CM2. In some embodiments, the control signal, CM1, CM2, are generated using one or more logic circuits, for example, a NOT gate and an OR gate. Control signals, CM1, and CM2, may be generated sequentially within an idle phase of the differential charge pump. Control of the dummy switches, S45, S46, S47, S48, can be described by Boolean operations as follows: $\overline{CM1}\&DN$, $\overline{CM1}\&UP$, $\overline{CM2}\&DN$, $\overline{CM2}\&UP$. An inverting input terminal of the error amplifier, A41, is connected to the voltage, $V_{CM}$, a non-inverting input terminal of the error amplifier, A41, is connected to the switches S43, S44, S49, S50, and the output terminal of the error amplifier, A41, is connected to the switches, S53, S54. In some embodiments, the current sources, CSN1, CSN2, are controlled by a voltage, Vg. The control unit is configured to, during an inactive operating phase of the differential charge pump 400 when the differential charge pump provides no current to the load, set the current source, CSP1, according to the current source, CSN2, and/or set the current source, CSP2, according to the current source, CSN1, and during an active operating phase of the charge pump that is subsequent to the first operating phase when the differential charge pump provides current to the load, provide current from the current source, CSP1, and/or the current source, CSP2, to the load of the differential charge pump.

An example of the operation of the differential charge pump 300 depicted in FIG. 4 is described as follows. When both the control signals, UP and DN, are 0, the switches S41, S42, S51, S52 are open (i.e., non-conductive), disconnecting the current sources CSP1, CSP2, CSN1, CSN2 from the load 410. Depending on which control signal (CM1 or CM2) is 1, at least some of the switches, S43, S50, S47, S46, S49, S44, S45, S50, are closed (i.e., conductive) and start to conduct current, from the current source, CSP1 to the current source, CSN2 or from the current source, CSP2 to the current source, CSN1. At the same time, one of the switches, S53 or S54, is closed, connecting the error amplifier, A41, to the corresponding current source, CSP1 or CSP2, and the corresponding sampling capacitor, CH1 or CH2, making one of the feedback loops A41-S53-CSP1-S43 or A41-S54-CSP2-S49 active. The error amplifier, A41, compares voltage at its' non-inverting input with the voltage, $V_{CM}$, at its inverting input, and generates a compensation error voltage, which is applied to the gate of the MOST current source CSP1 or CSP2, setting the current of the current source, CSP1, or CSP2, to be equal to the reference currents, Iref, of the current sources, CSN2, CSN1, respectively. The capacitors, CH1, CH2, track the voltage at the gates of the current sources, CSP1, CSP2. When the UP signal changes from 0 to 1 and the control signals, DN, CM1, CM2, all remain at 0, the switches, S45, S48, are open (i.e., non-conductive), and, the switches, S41, S52, are closed (i.e., conductive). As a result, the current flows in the load via the switches, S41 and S52, in the direction from the current source, CSP1, to the current source, CSN2. At the same time, the switches, S47, S46, are closed, maintaining a current flow between each of the current sources CSP2, CSN1, and the voltage source 440. If the DN signal changes to 1 and the control signals, UP, CM1, CM2 all remain at 0, the switches, S47, S46 are open (i.e., non-conductive), and, the switches, S51, S42 are closed (i.e., conductive). As a result, the current flows in the load via the switches, S51, and S42, from the current source, CSP2, to the current source, CSN1. At the same time, the switches, S45, S48 are closed (i.e., conductive), maintaining a current flow between each of the current sources CSP2, CSN1, and the voltage source 440. When the control signals, UP, and, DN, are at 1, the switches, S45-S48, are open (i.e., non-conductive) and the switches S41, S42, S51, S52 are closed (i.e., conductive). In this case, there is no current flow via the switches, S45-S48. The current flows from the current source, CSP1, to the current source, CSN1, via the switches S41, S42, and from the current source, CSP2 to the current source, CSN2, via the load switches, S51, S52.

Figure 5:
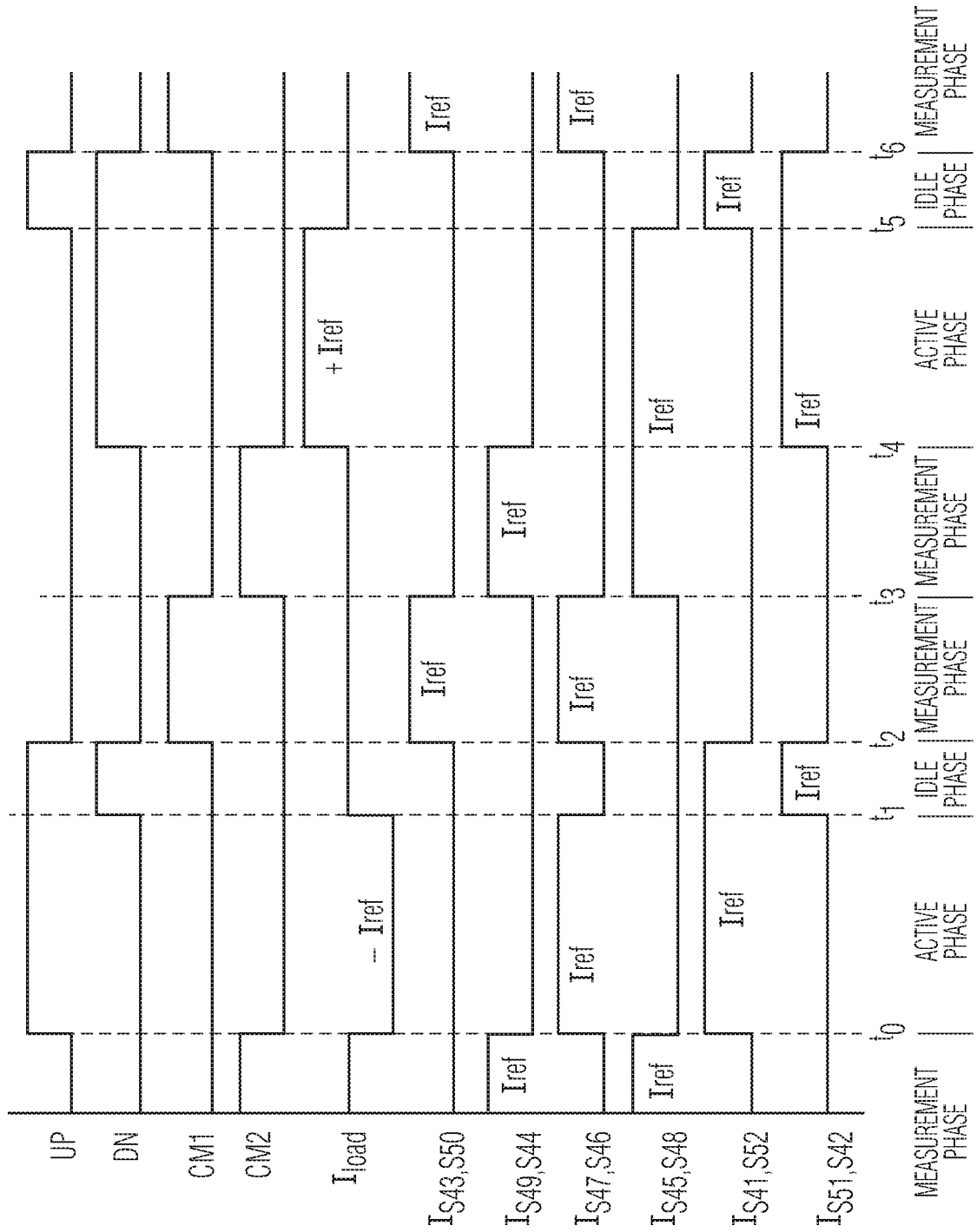
FIG. 5 illustrates a signal timing diagram of the differential charge pump depicted in FIG. 4.

FIG. 5 illustrates a signal timing diagram of the differential charge pump 400 depicted in FIG. 4. In the signal timing diagram illustrated in FIG. 5, the control signals, UP, DN, CM1, CM2, the load current, $I_{load}$, flowing through the load 410, the current, $I_{S43,S50}$, through the switches S43, S50, the current, $I_{S49,S44}$, through the switches S49, S44, the current, $I_{S47,S46}$, flowing through the switches S47, S46, the current, $I_{S45,S48}$, flowing through the switches S45, S48, the current, $I_{S41,S52}$, flowing through the switches S41, S52, and the current, $I_{S51,S42}$, flowing through the switches S51, S42, are shown in active, measurement, and idle phases of the differential charge pump. The load current, $I_{load}$, is the current that flows through the load when the UP signal is 1 and the DN signal is 0, or when the DN signal is 1 and the UP signal is 0. At time point, $t_0$, the control signal, UP, changes from 0 to 1, starting the active phase of the charge-pump, i.e., the time period when the differential charge pump provides current to the load. Starting from time point, $t_0$, the load current, $I_{load}$, is equal to $-I_{ref}$, indicating that the load current, $I_{load}$, flows from the current source, CSP1, to the current source, CSN2, via the load and via the switches, S41, S52 (current $I_{S41,S52}$ in FIG. 5). At the same time, the current $I_{S46,S47}$ flows through switches S46, S47, to keep the current sources, CSP2, CSN1, in saturation. At time point, $t_1$, the DN signal changes from 0 to 1 and the idle phase starts of the differential charge pump starts. During this idle phase, the switches S41, S42, S51, S52 are closed (i.e., conductive), and the switches S43-S50 are open (i.e., non-conductive). As a result, there are no current flow the switches S43-S50 (i.e., $I_{S43,S50}$, $I_{S49,S44}$, $I_{S47,S46}$, $I_{S45,S48}$ being zero). During this idle phase, there is no current in the load, as well, since the current flows directly from the current source, CSP1, to the current source, CSN1, and from the current source, CSP1, to the current source, CSN1, via the switches S41, S42 and S51, S52. At time point $t_2$, the UP, DN signals change to 0, the CM1 signal changes from 0 to 1, the current $I_{S43,S50}$, flows through the switches, S43, S50, from the current source, CSP1, to the current source, CSN2, measuring and adjusting the current source, CSP1. Because the control signal, CM1, is 1, the switch, S53, is closed and the error amplifier, A41, is connected to the current source, CSP1, and the sampling capacitor, CH1, making the feedback loop A41-S53-CSP1-S43 active. The error amplifier, A41, compares voltage at its' non-inverting input with the voltage, $V_{CM}$, at its inverting input, and generates a compensation error voltage, which is applied to the gate of the MOST current source CSP1, setting the current of the current source, CSP1, to be equal to the reference currents, Iref, of the current source, CSN2. At the same time, the current $I_{S47,S46}$ flows through the switches, S47, S46, to keep the current sources, CSP2, CSN1, in saturation. At time point $t_3$, the CM1 signal changes from 1 to 0, the CM2 signal changes from 0 to 1, and the current $I_{S49,S44}$ flows through the switches S49, S44, from the current source, CSP1, to the current source, CSN2, measuring and adjusting the current source, CSP2. Because the control signal, CM2, is 1, the switch, S54, is closed and the error amplifier, A41, is connected to the current source, CSP2, and the sampling capacitor, CH1, making the feedback loop A41-S54-CSP2-S49 active. The error amplifier, A41, compares voltage at its' non-inverting input with the voltage, $V_{CM}$, at its inverting input, and generates a compensation error voltage, which is applied to the gate of the MOST current source CSP2, setting the current of the current source, CSP2, to be equal to the reference currents, Iref, of the current source, CSN1. At time point $t_4$, the control signal, DN, changes from 0 to 1, starting the active phase of the charge-pump. The load current, $I_{load}$, is equal to $+I_{ref}$, indicating that the load current, $I_{load}$, flows from the current source, CSP2, to the current source, CSN1, via the load and via the switches S51, S42 (current $I_{S51,S42}$, in FIG. 5). At the same time, the current $I_{S45,S48}$, flows through the switches, S45, S48, to keep the current sources, CSP1, CSN2, in saturation. At time point $t_5$, UP signal goes to 1 and charge pump in idle phase again, similar as during the time points, $t_1$-$t_2$. At time point, $t_6$, the CM1 signal changes from 0 to 1 and both the UP and DN signals change from 1 to 0, and the measurement phase starts again.

Figure 6:
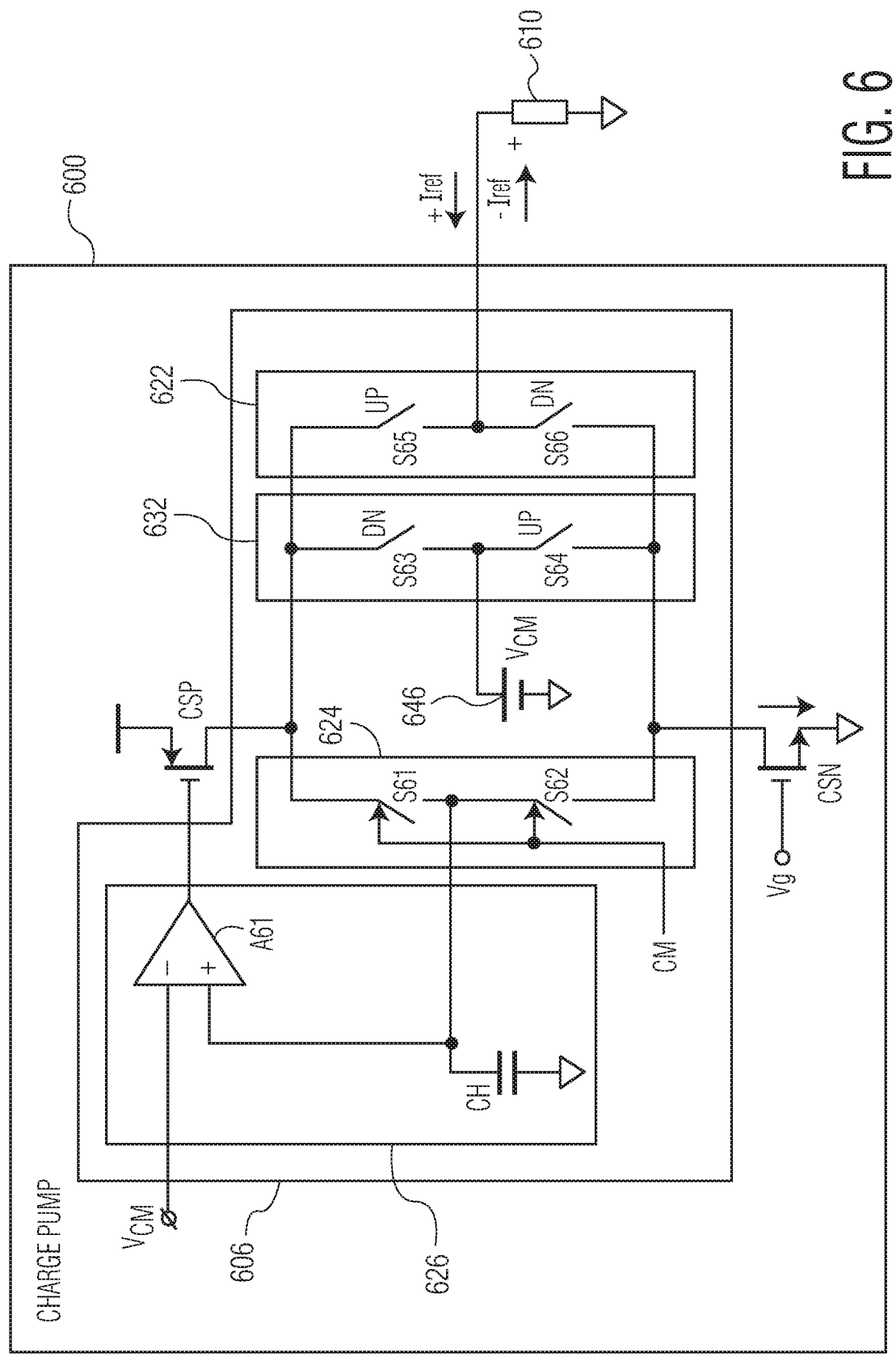
FIG. 6 depicts a single-ended charge pump in accordance with an embodiment of the invention.

FIG. 6 depicts a single-ended charge pump 600 in accordance with an embodiment of the invention. The single-ended charge pump depicted in FIG. 6 is an embodiment of the charge pump 100 depicted in FIG. 1. However, the charge pump depicted in FIG. 1 is not limited to the embodiment shown in FIG. 6. In the embodiment depicted in FIG. 6, the single-ended charge pump includes current sources, CSP, and CSN, which are implemented as PMOS and NMOS current sources respectively, and a control unit 606 configured to control the supply of current from the current sources to a load 610 of the charge pump. Although the illustrated single-ended charge pump is shown with certain components and described with certain functionality herein, other embodiments of the single-ended charge pump may include fewer or more components to implement the same, less, or more functionality.

In the embodiment depicted in FIG. 6, the control unit 606 includes a load switch set 622 connected to the load 610, a measurement branch 624, a dummy branch 632, and a feedback element 626. The measurement branch, the current source CSP, and the feedback element form a feedback loop. The measurement branch, the dummy branch, and the load switch set are connected between the current source, CSP, and the current source, CSN. The measurement branch includes two switches, S61, S62, the dummy branch includes two switches, S63, S64, and the load switch set includes two switches, S65, S66. The switches, S63, S64 in the dummy branch are connected to a voltage source 646 having a reference voltage, "$V_{CM}$." The switches, S63, S66, are controlled by a control signal, DN, and the switches, S64, S65, are controlled by a control signal, UP. The feedback element includes an error amplifier, A61, and a capacitor, CH. In the embodiment depicted in FIG. 6, the switch, S61, is connected to the current source, CSP, and to the non-inverting input terminal of the error amplifier, A61, the switch, S62, is connected to the switch, S61, to the current source, CSN, and to the non-inverting input terminal of the error amplifier, A61, the switch, S63, is connected to the switch, S61, to the current source, CSP, and to the voltage source, the switch, S64, is connected to the switch, S63, to the current source, CSN, and to the voltage source, the switch, S65, is connected to the switches, S61, S63, to the current source, CSP, and to the load, and the switch, S66, is connected to the switch, S65, to the current source, CSN, and to the load. The switches, S61, S62, are controlled by a control signal, CM, which is generated based on the control signals, DN, and UP. The control signal, CM, may be generated by one or more logic circuits. In some embodiments, the control signal, CM, is generated using a NOR gate. For example, the control signal, CM, is the output of the NOR gate and the control signals, DN, and UP, are inputs to the NOR gate. In some embodiments, instead of the capacitor, CH, parasitic capacitance at the input of the error amplifier, A61, is used. An inverting input terminal of the error amplifier, A61, is connected to a voltage, $V_{CM}$, and a non-inverting input of the error amplifier, A61, is connected between the switches, S61, and S62, and an output terminal of the error amplifier, A61, is connected to the current source, CSP. In the embodiment depicted in FIG. 6, the current source, CSP, is controlled by the feedback element and the current source, CSN, is used as a reference current source. However, in some other embodiments, the current source, CSN, is controlled by a feedback element and the current source, CSP, is used as a reference current source. In some embodiments, the current source, CSN, is controlled by a voltage, Vg. The control unit is configured to, during an inactive operating phase of the charge pump when the charge pump provides no current to the load, set the current source, CSP, according to the current source, CSN, and during an active operating phase of the charge pump that is subsequent to the first operating phase when the differential charge pump provides current to the load, provide current from the current source, CSP, to the load of the differential charge pump.

In an example of the operation of the charge pump 600 depicted in FIG. 6, the NMOS current source, CSN, is used as a reference current source while the PMOS current source, CSP, is adjusted through the feedback element. When both the control signals, UP and DN, are 0, the switches S65, S66 are open (i.e., non-conductive), disconnecting the current sources CSP, CSN, from the load 610. At the same time, the switches S63, S64 are also open, disconnecting the reference voltage, $V_{CM}$, from the current sources, CSP, CSN. When the signal, CM, changes to 1, the switches, S61, S62, become closed (i.e., conductive), the feedback loop A61-CSP-S61 is active. The error amplifier, A61, compares voltage at its non-inverting input with the voltage, $V_{CM}$, and generates a compensation error voltage, which is applied to the gate of the current source, CSP, setting the current of CSP to be equal to the reference currents, Iref, flowing through the current source CSN. The capacitor, CH, tracks the voltage at the non-inverting input of the amplifiers, A61. As soon as the UP or DN signal changes from 0 to 1, the control signal, CM, which can be generated using Boolean operation DN||UP, changes from 1 to 0, opening the switches, S61, S62 (i.e., non-conductive), and the voltage at the non-inverting input of the error amplifier, A61, is held on the voltage of the capacitor, CH. If the UP signal changes from 0 to 1 and the DN signal remains 0, the switch, S66, is open, and the switch, S65, is closed. As a result, the current flows in the load through the switch, S65, in the direction from the current source, CSP, to the ground. At the same time, the switch, S64, is closed, maintaining a current flow between the voltage source 646 and the current source, CSN, in order to keep the current source, CSN in the saturation region. If the DN signal changes from 0 to 1 and the UP signal remains 0, the switch, S65 is open, and S66 is closed. As a result, the current flows through the load via switch S66, in the direction from the load to the current source, CSN. At the same time, the switch, S63, is closed, maintaining a current flow between the current source, CSP, and the voltage source 646 in order to keep the current source, CSN, in the saturation region. When the UP and DN signals are both at 1, the switches, S61, S62, are open and switches, S63, S64, S65, S66, are closed. Current flows from the current source, CSP1, to the current source, CSN1, via the switches, S63, S64. Even though the switches S65, S66, are closed, there is no current through them because the switches S63, S64, are closed as well and connected to the voltage source 646, which has an output resistance much lower than the output resistances of the current sources CSP, CSN. As a result, the current provided by the current source, CSP, flows to the voltage source 646, and the current sunk by the current source, CSN, flows out of the voltage source 646. Since the currents generated by the current sources, CSN, and CSP, are equal and flow in opposite direction through the voltage source 646, the current through the voltage source 646 is cancelled.

Figure 7:
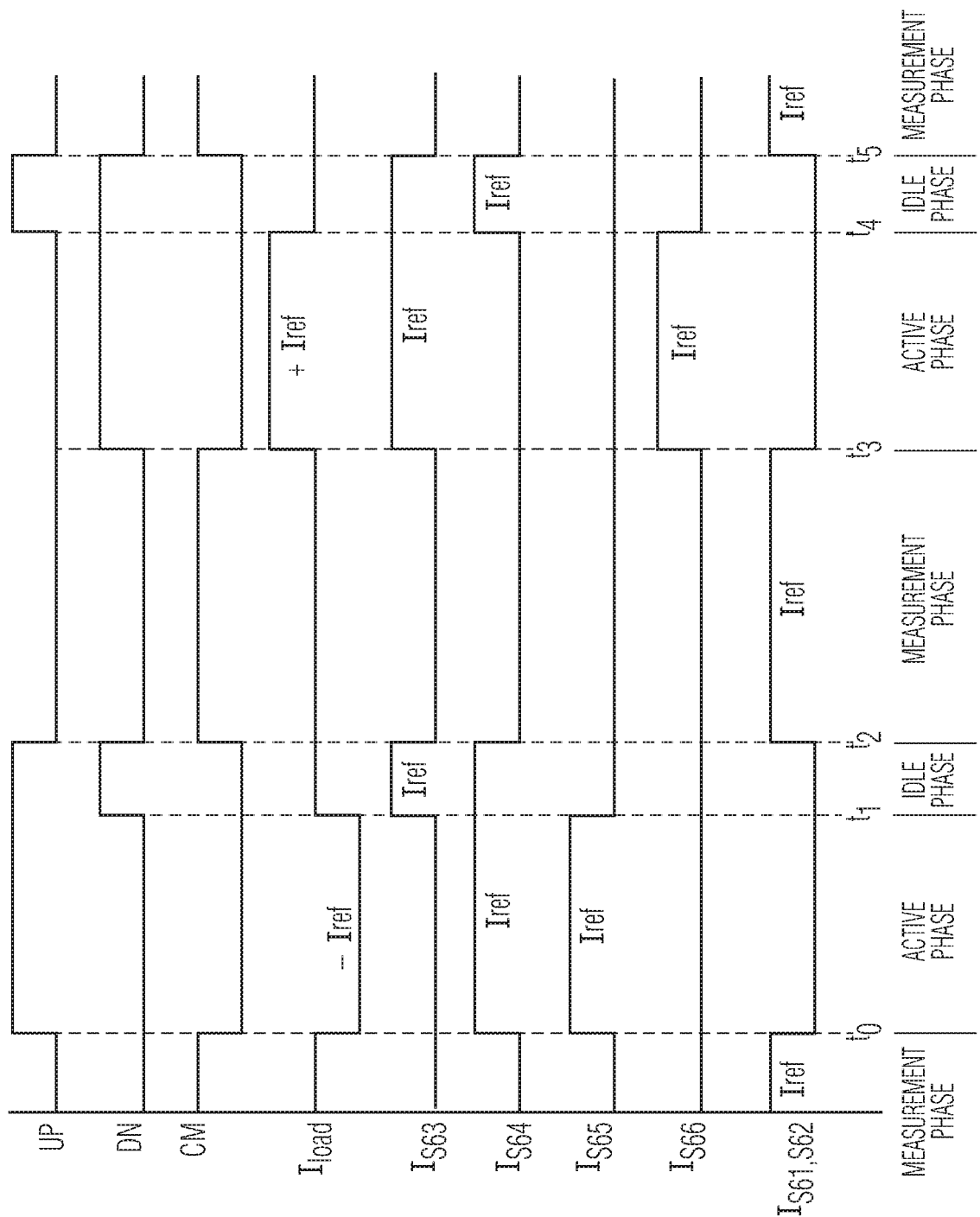
FIG. 7 illustrates a signal timing diagram of the single-ended charge pump depicted in FIG. 6.

FIG. 7 illustrates a signal timing diagram of the single-ended charge pump 600 depicted in FIG. 6. In the signal timing diagram illustrated in FIG. 7, the control signals UP, DN and CM, currents through the switches and the load current, $I_{load}$, flowing through the load 610 are shown in active, measurement, and idle phases of the single-ended charge pump. The load current, $I_{load}$, is the current that flows through the load when the UP signal is 1 and the DN signal is 0, or when the DN signal is 1 and the UP signal is 0. At time point, $t_0$, the control signal, UP, changes from 0 to 1, starting the active phase of the charge-pump, i.e., the time period when the single-ended charge pump provides current to the load. Starting from time point, $t_0$, the load current, $I_{load}$, is equal to $-I_{ref}$ indicating that the load current, $I_{load}$, flows from the current source, CSP, to the ground via the switch, S65, (current $I_{65}$ in FIG. 7). At the same time, the current $I_{s64}$ flows from the voltage source 646 to the current source, CSN, through the switch, S64, to keep the current source, CSN, in saturation. At time point, $t_1$, the DN signal changes from 0 to 1 and the idle phase of the single-ended charge pump starts. During this idle phase, there is no current flowing through the switches, S65, S66 (i.e., the current $I_{65}$, $I_{66}$ being zero), and, consequently, there is no current flowing through the load, since the current flows between current sources, CSP, CSN, and the voltage source 646, (depicted as $I_{63}$, $I_{64}$ in FIG. 7). At time point, $t_2$, both control signals, UP and DN, change from 1 to 0, causing the signal, CM to change from 0 to 1 (e.g., generated using Boolean operation $\overline{DN\|UP}$), and the measurement phase of the single-ended charge pump starts, during which current flow through the switches, S61, S62, depicted as $I_{61}$, $I_{62}$ in FIG. 7. At time point, $t_3$, the control signal, DN, changes from 0 to 1, causing the signal, CM, to change from 1 to 0. The load current, $I_{load}$, is equal to +$I_{ref}$, indicating that the load current, $I_{load}$, flows from the ground to the current source, CSN, via the switch, S66. At time point, $t_4$, the UP signal changes from 0 to 1 and the idle phase described above starts. At time point, $t_5$, the measurement phase starts again.

Figure 8:
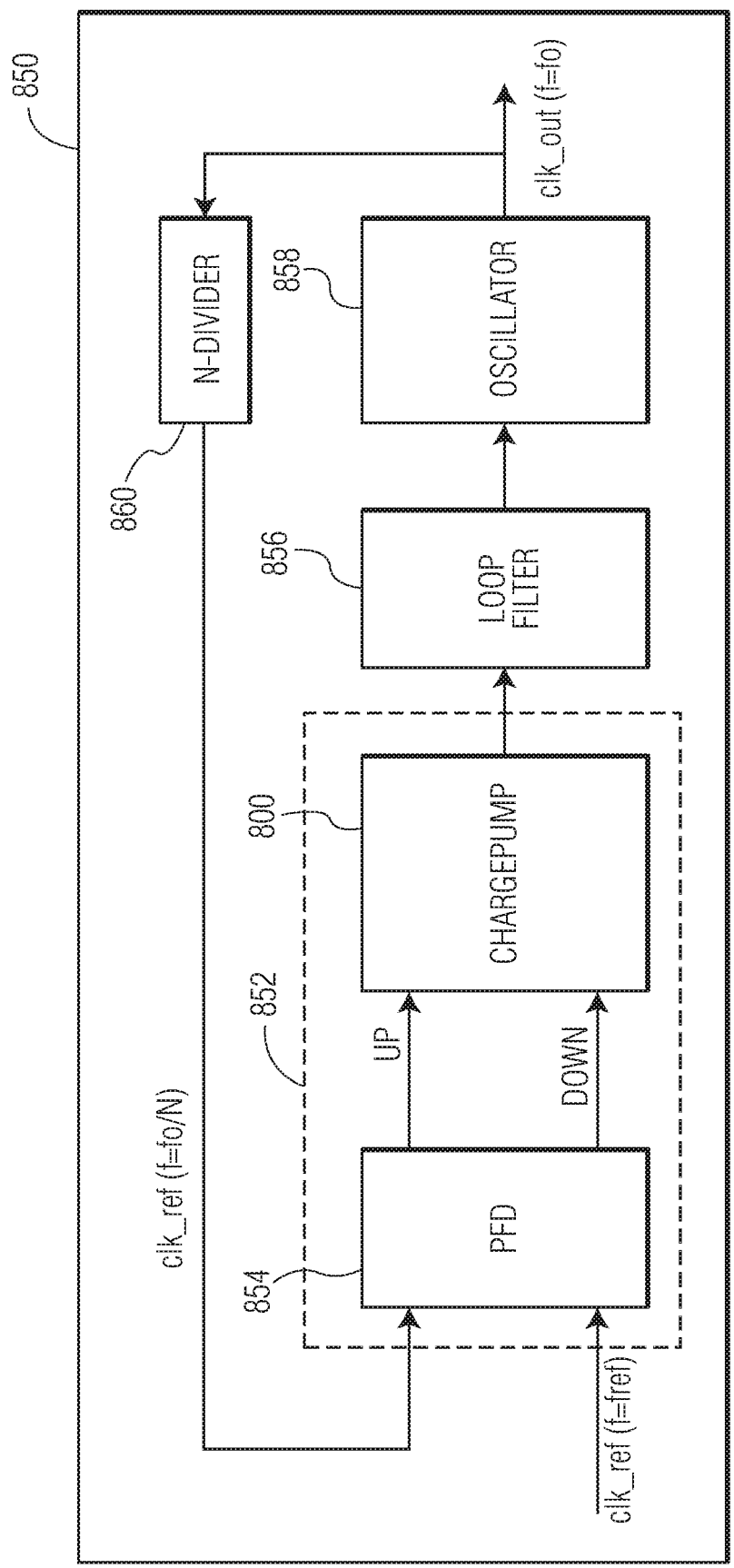
FIG. 8 is a schematic block diagram of a PLL in accordance with an embodiment of the invention.

FIG. 8 is a schematic block diagram of a PLL 850 that includes a charge pump 800 in accordance with an embodiment of the invention. In some embodiments, the PLL is used to compare the phase of a reference signal with the phase of a signal that is derived from the output signal of the PLL and adjusts its controlled oscillator to keep the phases matched. The PLL can be used for wireless communications, computers, and other electronic applications. In the embodiment depicted in FIG. 8, the PLL includes a phase/frequency detector (PFD) 854, the charge pump 800, a loop filter 856, an oscillator 858, and a frequency divider 860. In some embodiments, the PFD and the charge pump are implemented as a phase/frequency detector system 852. The charge pump 800 depicted in FIG. 8 is an embodiment of the charge pump 100 depicted in FIG. 1. However, the charge pump depicted in FIG. 1 is not limited to the embodiment shown in FIG. 8. The PFD is configured to receive a reference phase signal "clk_ref," and a feedback phase signal, "clk_fb," from the frequency divider and generates "up" and "down" frequency control signals. In the PLL depicted in FIG. 8, the loop filter is the load of the charge pump. The charge pump is configured to receive the "up" and "down" frequency control signals from the PFD and generate a signal based on the frequency control signal, which is input into the loop filter for the control of the oscillator. In an embodiment, the charge pump converts these control signals into either a current sourced to its output terminal, a current sinked from its output terminal, or no current through its output terminal. Under the control of the loop filter, the oscillator generates a clock signal, "clk_out," and outputs the clock signal to the frequency divider. In response to the clock signal, the frequency divider generates the feedback phase signal, "clk_fb." In an embodiment, the frequency divider is an N-divider (N is a positive integer) that the clock signal, "clk_out," is N times the frequency of the feedback phase signal, "clk_fb."

FIG. 9 is a process flow diagram that illustrates a method for operating a charge pump in accordance with an embodiment of the invention. The charge pump may be the same as or similar to the charge pump 100 depicted in FIG. 1, the charge pump 200 depicted in FIG. 2, the charge pump 400 depicted in FIG. 4, the charge pump 500 depicted in FIG. 5, the charge pump 700 depicted in FIG. 7, and/or the charge pump 800 depicted in FIG. 8. At block 902, during a first operating phase of the charge pump (e.g., during the measurement phase of FIGS. 3, 5, and 7), a first current source of the charge pump is set according to a second current source of the charge pump. At block 904, during a second operating phase of the charge pump (e.g., during the active phase of FIGS. 3, 5, and 7) that is subsequent to the first operating phase, current is provided from the first and second current sources to a load of the charge pump.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A method for operating a charge pump, the method comprising:
   during a first operating phase of the charge pump, setting a first current source of the charge pump according to a second current source of the charge pump; and
   during a second operating phase of the charge pump that is subsequent to the first operating phase, providing current from the first current source to a load of the charge pump via a current path;
   wherein during the first operating phase of the charge pump, the charge pump provides no current to the load.

2. The method of claim 1, wherein during the first operating phase of the charge pump, setting the first current source of the charge pump according to the second current source of the charge pump comprises during the first operating phase of the charge pump, setting the first current source of the charge pump to have the same current level as the second current source of the charge pump.

3. The method of claim 1, wherein during the first operating phase of the charge pump, setting the first current source of the charge pump to have the same current level as the second current source of the charge pump comprises during the first operating phase of the charge pump, setting the first current source of the charge pump using at least one error amplifier having an output terminal connected to the first current source and an input terminal connected to a reference voltage.

4. A charge pump, the charge pump comprising:
   at least a first current source and a second current source; and
   a control unit connected to the at least first and second current sources, wherein the control unit is configured to:
   during a first operating phase of the charge pump, set the first current source of the charge pump according to the second current source of the charge pump; and during a second operating phase of the charge pump that is subsequent to the first operating phase, provide current from the first current source to a load of the charge pump;
wherein during the first operating phase of the charge pump, the charge pump provides no current to the load.

5. The charge pump of claim 4, wherein the control unit is further configured to, during the first operating phase of the charge pump, set the first current source of the charge pump to have the same current level as the second current source of the charge pump.

6. The charge pump of claim 4, wherein the control unit comprises a feedback element having at last one error amplifier whose output controls a current level provided by the first current source.

7. The charge pump of claim 4, wherein the charge pump further comprises a third voltage source and a fourth voltage source, and wherein the control unit is further configured to:
during the first operating phase of the charge pump, set the third current source of the charge pump according to the fourth current source of the charge pump; and
during the second operating phase of the charge pump that is subsequent to the first operating phase, provide current from the third current source to the load of the charge pump.

8. The charge pump of claim 7, wherein the control unit comprises:
a feedback element connected to the first and third current sources, wherein the feedback element comprises:
a first error amplifier having an output terminal connected to the first current source and a first input terminal connected to a first capacitor connected to a reference voltage and a first feedback switch; and
a second error amplifier having an output terminal connected to the third current source and a first input terminal connected to a second capacitor connected to the reference voltage and a second feedback switch; and
a plurality of switches connected between the first, second, third, and fourth current sources, the first and second feedback switches, and the load.

9. The charge pump of claim 8, wherein the switches comprise:
a first switch connected to the first current source and to the load;
a second switch connected to the load, to the fourth current source, and to the first switch;
a third switch connected to the first current source and to the first feedback switch;
a fourth switch connected to the fourth current source and to the second feedback switch;
a fifth switch connected to the third current source, to the second feedback switch, and to the fourth switch;
a sixth switch connected to the fourth current source, to the third switch, and to the first feedback switch;
a seventh switch connected to the third current source and to the load; and
an eighth switch connected to the fourth current source, to the seventh switch, and to the load.

10. The charge pump of claim 8, wherein the first error amplifier is configured to, during the first operating phase, compare a threshold voltage with a sampled voltage at the first capacitor to generate a control signal for setting the first current source of the charge pump to have the same current level as the second current source of the charge pump, and wherein the second error amplifier is configured to, during the first operating phase, compare the threshold voltage with a sampled voltage at the second capacitor to generate a control signal for setting the third current source of the charge pump to have the same current level as the fourth current source of the charge pump.

11. The charge pump of claim 7, wherein the control unit comprises:
a feedback element connected to the first and third current sources, wherein the feedback element includes an error amplifier having an output terminal connected to the first and third current sources through two switches and a first input terminal connected to a reference voltage; and
a plurality of switches connected between the first, second, third, and fourth current sources, a second input terminal of the error amplifier, and the load.

12. The charge pump of claim 11, wherein the switches comprise:
a first switch connected to the first current source and to the load;
a second switch connected to the load, to the fourth current source, and to the first switch;
a third switch connected to the first current source and to the second input terminal of the error amplifier;
a fourth switch connected to the fourth current source, to the second input terminal of the error amplifier, and to the third switch;
a fifth switch connected to the first current source and to a voltage source;
a sixth switch connected to the fourth current source, to the fifth switch, and to the voltage source;
a seventh switch connected to the third current source and to the voltage source;
an eighth switch connected to the second current source, to the seventh switch, and to the voltage source;
a ninth switch connected to the third current source and to the second input terminal of the error amplifier;
a tenth switch connected to the second current source, to the second input terminal of the error amplifier, and to the ninth switch;
an eleventh switch connected to the second current source and to the load; and
a twelfth switch connected to the load, to the second current source, and to the eleventh switch.

13. The charge pump of claim 12, wherein the first and twelfth switches are controlled by a first signal, wherein the second and eleventh switches are controlled by a second signal, wherein the third and tenth switches are controlled by a third signal, wherein the fourth and ninth switches are controlled by a fourth signal, wherein the fifth and eighth switches are controlled by a fifth signal, and wherein the sixth and seventh switches are controlled by a sixth signal.

14. The charge pump of claim 4, wherein the control unit comprises:
a feedback element connected to the first current source, wherein the feedback element includes an error amplifier having an output terminal connected to the first current source and a first input terminal connected to a reference voltage; and
a plurality of switches connected between the first and second current sources, a second input terminal of the error amplifier, and the load.

15. The charge pump of claim 14, wherein the error amplifier is configured to, during the first operating phase, compare the reference voltage with a voltage at the second input terminal to generate a control signal for setting the first current source of the charge pump to have the same current level as the second current source of the charge pump.

16. The charge pump of claim 14, wherein the switches comprise:
a first switch connected to the first current source and to the second input terminal of the error amplifier;
a second switch connected to the first switch, to the second current source, and to the second input terminal of the error amplifier;
a third switch connected to the first switch, to the first current source, and to a voltage source;
a fourth switch connected to the third switch, to the second current source, and to the voltage source;
a fifth switch connected to the first and third switches, to the first current source, and to the load; and
a sixth switch connected to the fifth switch, to the second current source, and to the load.

17. The charge pump of claim 16, wherein the first and second switches are controlled by a first signal, wherein the fourth and fifth switches are controlled by a second signal, and wherein the third and sixth switches are controlled by a third signal.

18. A charge pump, the charge pump comprising:
at least a first current source and a second current source; and
a control unit connected to the at least first and second current sources, wherein the control unit is configured to:
during a first operating phase of the charge pump, set the first current source of the charge pump according to the second current source of the charge pump; and
during a second operating phase of the charge pump that is subsequent to the first operating phase, provide current from the first current source to a load of the charge pump;
wherein current flows through the load in opposite directions at alternating time periods.

19. A charge pump, the charge pump comprising:
first, second, third, and fourth current sources; and
a control unit connected to the first, second, third, and fourth current sources, wherein the control unit comprises:
a feedback element connected to the first and third current sources, wherein the feedback element comprises:
a first error amplifier having an output terminal connected to the first current source and a first input terminal connected to a first capacitor connected to a reference voltage and a first feedback switch, wherein the first error amplifier is configured to, during an inactive operating phase during which the charge pump provides no current to a load, compare a threshold voltage with a sampled voltage at the first capacitor to generate a control signal for setting the first current source of the charge pump to have the same current level as the second current source of the charge pump; and
a second error amplifier having an output terminal connected to the third current source and a first input terminal connected to a second capacitor connected to the reference voltage and a second feedback switch, wherein the second error amplifier is configured to, during the inactive operating phase, compare the threshold voltage with a sampled voltage at the second capacitor to generate a control signal for setting the third current source of the charge pump to have the same current level as the fourth current source of the charge pump;
a first switch connected to the first current source and to the load;
a second switch connected to the load, to the fourth current source, and to the first switch;
a third switch connected to the first current source and to the first feedback switch;
a fourth switch connected to the fourth current source and to the second feedback switch;
a fifth switch connected to the third current source, to the second feedback switch, and to the fourth switch;
a sixth switch connected to the fourth current source, to the third switch, and to the first feedback switch;
a seventh switch connected to the third current source and to the load; and
an eighth switch connected to the fourth current source, to the seventh switch, and to the load.

20. The charge pump of claim 19, wherein during the inactive operating phase, each of the first, second, third, and fourth current sources is connected to the load through the first switch, the second switch, the seventh switch, and the eighth switch, respectively, and the charge pump provides no current to the load.

* * * * *